United States Patent [19]

Takahashi et al.

[11] Patent Number: 5,544,653
[45] Date of Patent: Aug. 13, 1996

[54] MAGNETIC RESONANCE IMAGING METHOD AND APPARATUS

[75] Inventors: Tetsuhiko Takahashi, Souka; Shinji Kawasaki, Tokyo; Hiroshi Nishimura, Kashiwa, all of Japan

[73] Assignee: Hitachi Medical Corporation, Tokyo, Japan

[21] Appl. No.: 330,070

[22] Filed: Oct. 26, 1994

[30] Foreign Application Priority Data

Oct. 28, 1993 [JP] Japan .................................. 5-270952

[51] Int. Cl.$^6$ ........................................................ A61B 5/55
[52] U.S. Cl. ........................................ 128/653.2; 324/309
[58] Field of Search ........................ 128/653.2; 324/309

[56] References Cited

U.S. PATENT DOCUMENTS

| | | | |
|---|---|---|---|
| 4,588,948 | 5/1986 | Mansfield | 324/309 |
| 5,031,624 | 7/1991 | Mistretta et al. | 128/653.3 |
| 5,157,330 | 10/1992 | Kaufman et al. | 324/320 |
| 5,275,164 | 1/1994 | Maeda et al. | 128/653.2 |
| 5,329,231 | 7/1994 | Hatta et al. | 324/309 |
| 5,422,577 | 6/1995 | Kasugai | 324/309 |

*Primary Examiner*—Krista A. Zele
*Assistant Examiner*—Brian L. Casler
*Attorney, Agent, or Firm*—Antonelli, Terry, Stout & Kraus

[57] ABSTRACT

A radio frequency pulse to excite nuclei constituting an object to be imaged, a slice selecting gradient magnetic field pulse applied when the radio frequency magnetic field pulse is applied, a phase encoding gradient magnetic pulse, a frequency encoding gradient magnetic field pulse are applied to the object to be imaged placed in a static magnetic field. Then the generated nuclear magnetic resonance signals are detected many times to form an image of the internal structure of the object to be imaged using the detected signals. In this occasion, the amplitude of the slice selecting gradient magnetic field pulse or the width of the radio frequency pulse is changed corresponding to the amount of phase encoding given by the phase encoding gradient magnetic field pulse. In multi-slice imaging for detecting the signals from a plurality of slices spatially laminated, part of the signals are used in common between the slices adjacent to each other when two-dimensional images of those slices are reconstructed.

14 Claims, 8 Drawing Sheets

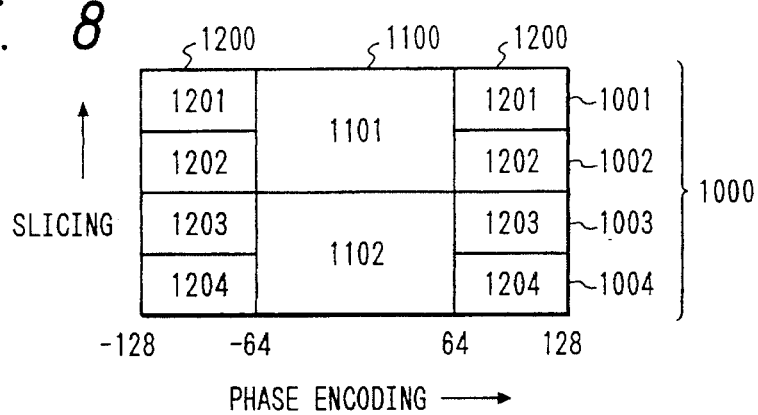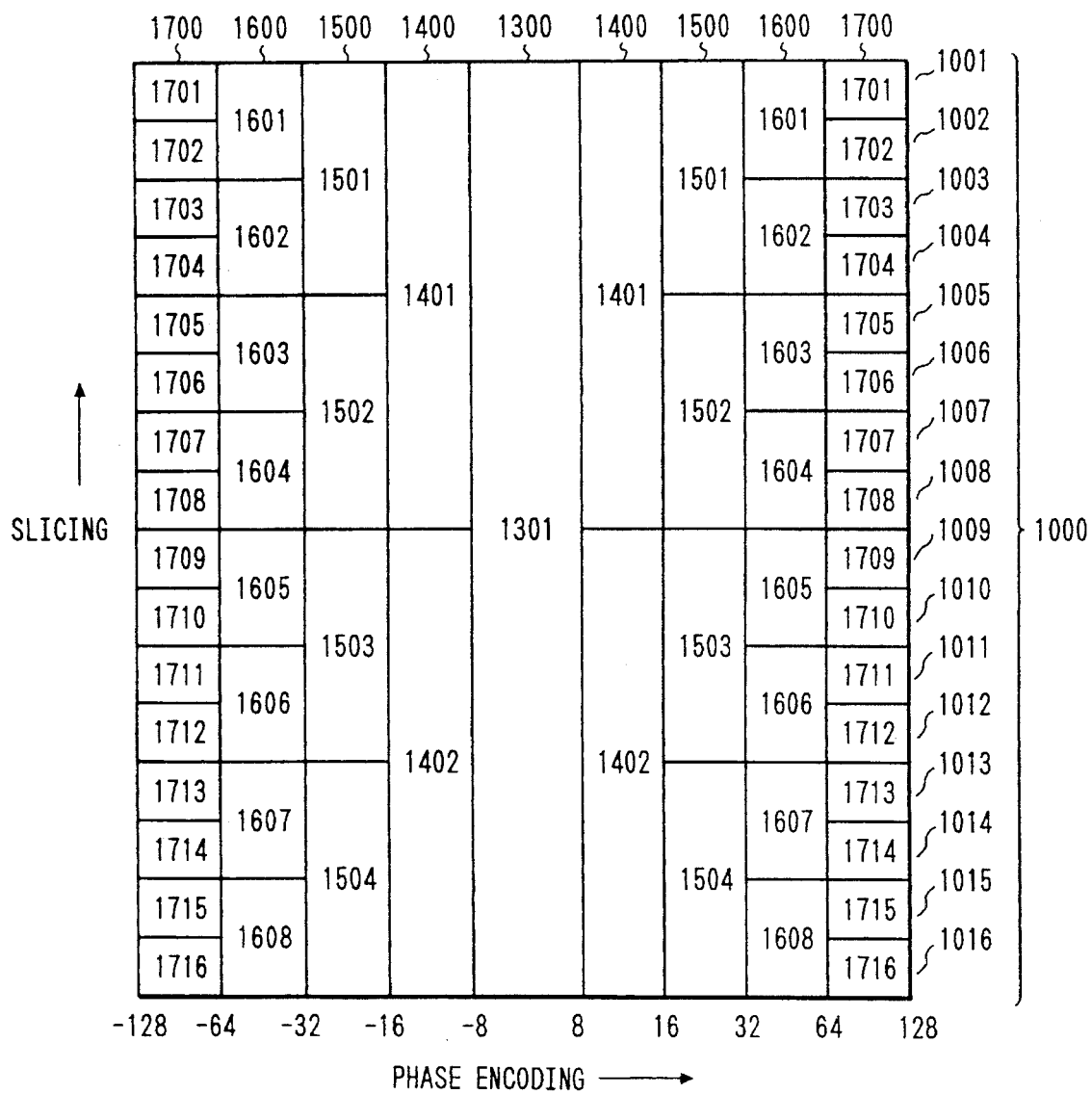

FIG. 10

| REGION | PHASE ENCODING NO. | SLICE THICKNESS (mm) | SIZE ON THE CORRESPONDING REAL SPACE IN THE DIRECTION OF PHASE ENCODING (mm) | CORRESPONDING SPATIAL FREQUENCY IN THE DIRECTION OF PHASE ENCODING (1p/mm) |
|---|---|---|---|---|
| 1300 | $-8 \sim 8$ | 16 | $256 \sim 16$ | $0 \sim 0.031$ |
| 1400 | $-16 \sim -9$ $16 \sim 9$ | 8 | $16 \sim 8$ | $0.031 \sim 0.062$ |
| 1500 | $-32 \sim -17$ $32 \sim 17$ | 4 | $8 \sim 4$ | $0.062 \sim 0.125$ |
| 1600 | $-64 \sim -33$ $64 \sim 33$ | 2 | $4 \sim 2$ | $0.125 \sim 0.250$ |
| 1700 | $-128 \sim -65$ $128 \sim 65$ | 1 | $2 \sim 1$ | $0.250 \sim 0.500$ |

FIG. 11

| REGION | THE NUMBER OF TIMES OF SIGNAL ACQUISITION |
|---|---|
| 1800 | 128 × 16 = 2048 |
| 1600 | 64 × 8 = 512 |
| 1500 | 32 × 4 = 128 |
| 1400 | 16 × 2 = 32 |
| 1300 | 16 × 1 = 16 |
| TOTAL | 2736 |

MAGNETIC RESONANCE IMAGING METHOD AND APPARATUS

BACKGROUND OF THE INVENTION

The present invention relates to a nuclear magnetic resonance imaging (hereinafter, referred to as "MRI") method and apparatus in which density distribution or relaxation time distribution is imaged by measuring nuclear magnetic resonance (hereinafter, referred to as "NMR") signals emitted from hydrogen or phosphorous in an object to be imaged.

In an MRI apparatus widely used in the field of clinic in the present years, obtained is geometrical information utilizing protons which are main constitutional elements of an object to be imaged. MR images widely used in the field of clinic in the present years are a two-dimensional cross-sectional, a two-dimensional sagittal-sectional and a two-dimensional coronary-sectional images of the head, the cervix, the spinal column, joints or the like. In a case of obtaining these images, often used is multi-slice imaging where a plurality of laminated cross-sections are sequentially imaged.

There are various imaging methods of an MRI apparatus which are characterized by the sequences of magnetic field pulses applied. As the typical imaging pulse sequences, FIG. 1 shows the pulse sequence in a spin echo (hereinafter, referred to as "SE") method, FIG. 2 showing the pulse sequence in a gradient echo (hereinafter, referred to as "GrE") method. In these pulse sequences, gradient magnetic field pulses $G_Z$, $G_Y$, $G_X$ having different directions perpendicular to each other are used, respectively. These gradient magnetic field pulses are called a slice selecting gradient magnetic field $G_Z$ 200 to determine a slice, a phase encoding gradient magnetic field pulse $G_Y$ 300 to encode spacial information in the y-direction into the phase of signals, and a read-out gradient magnetic field pulse or frequency encoding gradient magnetic field pulse $G_X$ 400, respectively.

In the SE method shown in FIG. 1, a 90° radio frequency pulse 101 is firstly irradiated while a slice selecting gradient magnetic field $G_Z$ 201 is being applied, and then a phase encoding gradient magnetic field pulse $G_Y$ is applied. Next, a 180° radio frequency pulse 102 is irradiated, and finally a signal is read out while a frequency encoding (read-out) gradient magnetic field pulse 401 is being applied as shown in the figure. The signal is obtained as an echo signal 501.

On the other hand, in the GrE method shown in FIG. 2, it is different from the pulse sequence in FIG. 1. The pulse sequence is the same as that in FIG. 1 except that an echo signal 501 is obtained by reversing a gradient magnetic field pulse $G_X$ 402 instead of applying the 180° radio frequency magnetic field pulse 102.

In order to obtain image data comprising 256×256 image elements through such a pulse sequence, the pulse sequence shown in FIG. 1 is basically repeated 256 times by setting the number of data points for reading out the echo signal 501 while the intensity of the phase encoding gradient magnetic field pulse $G_Y$ 301 is being varied step by step. When a sheet of image is detected, the signals are generally detected under the same thickness of slice. The reason is because it is mathematically ideal that all items of the data used in forming an image have the same thickness of slice. The typical thicknesses of slice are 2 mm, 7 mm, 5 mm, 10 mm and so on.

FIG. 3 is a schematic view showing signals obtained in such a conventional imaging pulse sequence. All the slice thicknesses are constant throughout the region 703 of phase encoding. The slicing thickness is generally determined by the amplitude of the slice selecting gradient magnetic field pulse $G_Z$ 201 applied concurrently with the radio frequency pulse 101 and the width of the radio frequency pulse 101. In other words, (1) the slice selecting gradient magnetic field pulse $G_Z$ 201 is applied in a pulse to temporarily produce a spatial-dependent magnetic field for spatially varying the resonance frequency of an object to be imaged, and then (2) a radio frequency pulse having only a certain frequency band, for typical example, 90° radio frequency pulse having a sinc-function-shape, is applied to selectively excite the atomic nuclei existing inside a limited space (slice) among the atomic nuclei constructing the object to be imaged. Therefore, the amplitude of the slice selecting magnetic field pulse $G_Z$ 201 is constant while the signal detection described above is being repeated 256 times.

Although, in the conventional imaging method, an image is reconstructed using the data obtained from the same slice thickness as described above, there is no need in the actual clinical application to satisfy the condition. That is, the spatial frequency components in the internal construction of human body are not homogeneous. In addition, there is the most important frequency for diagnosis point of view depending on the subject organ or part. For example, in order to image a fine structure such as a blood vessel, the spatial frequency of 0.25 to 0.5 1 p/mm is important, and the spatial frequency less than the value above is not important for imaging the edge of the fine structure. Furthermore, such a low radio frequency component is three-dimensional isotropic in most cases.

However, since the conventional method uses the slice selecting gradient magnetic field pulse having a constant amplitude independent of the importance of spatial frequency, there have been some cases where a necessary S/N ratio cannot obtained or a high spatial resolution cannot be obtained depending on the organ or the part.

In order to obtain multi-slice images through the conventional imaging method of this type, it is required to repeat the 256 times of signal acquisition sequences as many times as the number of slices required with varying the amplitude of the slice selecting gradient magnetic field pulse 201. For example, when 10 slices are required, the repeating number of signal acquisition sequences totals 256×10=2560 times. That is, the signal acquisition is repeated as many times as the number of slices by varying the intensity of the slice selecting gradient magnetic field $G_Z$.

In the SE method shown in FIG. 1, it is required to provide a waiting period $T_r$ from a first 90° radio frequency pulse 101 to the following 90° radio frequency pulse 101 (not shown) long enough to wait for the recovery of longitudinal magnetization of spins. Since the value of the waiting period is long, from 300 ms to 2 s, there has been developed a technique where the signal in another slice is acquired during this waiting period. In this case, the time required for measuring is not always 2560 times of a signal acquisition sequence as described above.

However, the number of slices measurable during the waiting period $T_r$ depends on the waiting period $T_r$ and an echo time $T_e$ which is a parameter dominating image quality, and is usually 3 to 10 slices. Therefore, in a case of imaging during a short waiting period $T_r$ or imaging a lot of slices as many as 20 slices, the measuring time increases as a result.

On the other hand, in the GrE method in FIG. 2, the main method is a fast GrE method where signal is continuously acquired without waiting the recovery of the longitudinal magnetization. In this case, in order to obtain 10 multi-slice images, the number of repeating times becomes 2560 times and the measuring time becomes 2560 times as the calculation.

Since the multi-slice images are important from a clinical point of view because of containing a lot of diagnostic information, it is strongly required to improve the speed of measurement because of a lot of repeating times and a long imaging time as described above. Further, as a future important application of the multi-slice imaging, there is the measurement of brain functions. In this measurement, light or sound is used for stimulating a human body and the reaction of the brain against the stimulation is observed as an MRI image. Since the response time of brain activation is approximately 10 seconds or less, it is required to detect a three-dimensional image of brain with a speed of this order.

In the past, in order to improving the imaging speed, efforts have been focused in shortening the time to obtain the image of one slice. Although some of the methods are succeed in practical uses as a fast GrE method, fast SE method, half-scanning method and so on, change in or degradation of image quality to a some extent cannot be avoided as the imaging speed increases.

SUMMARY OF THE INVENTION

An object of the present invention is to provide a magnetic resonance imaging method and apparatus wherein the quality of image is improved and the time for imaging is shortened when a lot of images are imaged as in multi-slice imaging.

According to the present invention, nuclear magnetic resonance imaging signals are generated from a slice of an object to be imaged perpendicular to a first axis, by repeatedly applying a radio frequency pulse, a slice selecting gradient magnetic field pulse along said first axis, a phase encoding gradient magnetic field pulse along a second axis perpendicular to said first axis and a frequency encoding gradient magnetic field pulse along a third axis perpendicular to said first and second axes to said object to be imaged placed in a static magnetic field, while varying the amount of phase encoding given by said phase encoding gradient magnetic field pulse. The thickness of said slice is changed corresponding to said amount of phase encoding given by said phase encoding gradient magnetic field pulse so that said nuclear magnetic resonance signals are obtained from said slice which has been changed in thickness. An image of said object to be imaged is produced on the basis of said nuclear magnetic resonance signals obtained from said slice which has been changed in thickness.

The thickness of said slice is determined such that when the absolute value of the amount of phase encoding given by said phase encoding gradient magnetic field pulse is small, the thickness becomes thinner than that when the absolute value is large. The thickness may be varied by changing the amplitude of said slice selecting gradient magnetic field pulse and/or the width of said radio frequency pulse.

According to another aspect of the present invention, nuclear magnetic resonance imaging signals are generated from a plurality of laminated slices of an object to be imaged perpendicular to a first axis by repeatedly applying a radio frequency pulse, a slice selecting gradient magnetic field pulse along said first axis, a phase encoding gradient magnetic field pulse along a second axis perpendicular to said first axis and a frequency encoding gradient magnetic field pulse along a third axis perpendicular to said first and second axes to said object to be imaged placed in a static magnetic field while varying the amount of phase encoding given by sail phase encoding gradient magnetic field pulse. The thickness of the slices is changed corresponding to said amount of phase encoding given by said phase encoding gradient magnetic field pulse so that said nuclear magnetic resonance signals are obtained from said slices which have been changed in thickness. A multi-slice image of said object to be imaged is produced by reconstructing two-dimensional images of said slices on the basis of said nuclear magnetic resonance signals obtained from said slices which have been changed in thickness.

The foregoing and other objects and features of the present invention will be apparent from the following description with referring to the accompanying drawings.

BRIEF DESCRIPTION OF THE DRAWINGS

FIG. 8 is a schematic perspective view showing a region of signals obtained by using the magnetic resonance imaging pulse sequence according to the present invention.

FIG. 9 is a schematic view showing another region of signals obtained by using the magnetic resonance imaging pulse sequence according to the present invention.

FIG. 10 is a table showing the splitting method of the slice region in the direction of phase encoding axis in the case of the schematic view in FIG. 9.

FIG. 11 is a table showing the number of repeating times of the magnetic resonance imaging pulse sequence in the case of the schematic view in FIG. 9.

DETAILED DESCRIPTION OF THE PREFERRED EMBODIMENTS

Figure 1:
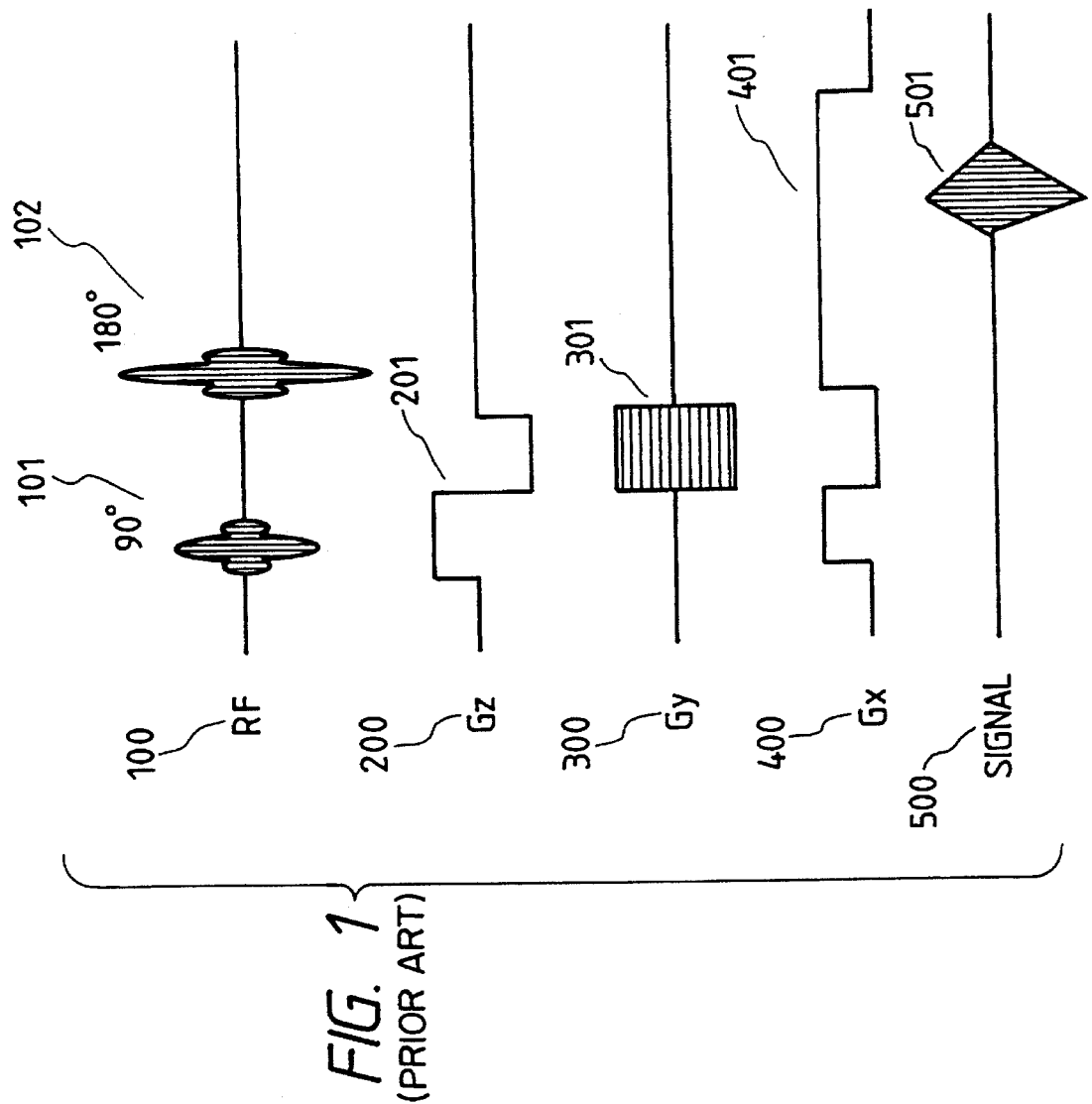
FIG. 1 is a view showing a conventional magnetic resonance imaging pulse sequence.

The basic principle of the present invention will be firstly described before describing embodiments.

In general, the variation in Larmor frequencies of nuclear spins in a slice, that is, the nuclear spin resonance frequency band $\Delta f$ is expressed as the following equation, where the thickness of the slice is S, the magnitude (strength) of the slice selecting gradient magnetic field pulse $G_z$ being $G_{zl}$.

$$S = 2 \cdot \pi \cdot \Delta f / (\gamma \cdot G_{zl}) = 4 \cdot \pi / \gamma \cdot (G_{zl} \cdot T)$$

Therein, $\Delta$ is the gyromagnetic ratio and T is the width of radio frequency pulse. It is apparent from the equation that the thickness of the slice is determined by $\Delta f$ and $G_{zl}$ or T and $G_{zl}$. The thickness of the slice is varied so that, when the absolute value of the amount of phase encoding given by a phase encoding gradient magnetic field pulse is small, the slice is thicker than that when the absolute value of the amount of phase encoding is large. The amount of phase encoding is representative of the integration of the phase encoding gradient magnetic field pulse.

By varying the thickness of the slice corresponding to the amount of phase coding given by the phase encoding gradient magnetic field pulse as described above, the S/N ratio increases owing to increase in the amount of signals by the increasing amount of the thickness of the slice when the amount of phase encoding is small. Further, when the amount of phase encoding is large, more information on the fine structure is contained since the spatial resolution in the direction of slicing also becomes high as compared with in a conventional apparatus. Therefore, when the image-reconstruction is performed by combining the signals when the amount of phase encoding is small and the signals when the amount of phase encoding is large, an image having a high S/N ratio or a high spatial resolution as compared with the conventional apparatus.

In a case of multi-slice imaging, a part among a set of signals detected in each slice can be shared among parts of plural slices. Particularly, since the thickness of slice is large when the amount of phase encoding is small, the spatial arrangement can be overlapped with its adjacent slices. Therefore, in the multi-slice imaging, the signals are acquired from each of slices only when the amount of phase encoding is large, and the signals can be used in common among the adjacent slices when the amount of phase encoding is small. As a result, the total number of times of signal acquisition decreases and the time required for multi-slice imaging can be shortened. By making good use of the time newly produced by shortening the imaging time, the quality of image can be further improved if the time is used in the well-known signal accumulation.

The method according to the present invention can be used together with the conventional high-speed technology such as in a fast GrE method, fast SE method, echo planar method and so on if necessary. By doing so, it can be realized that the speed of multi-slice imaging is further improved.

Figure 4:
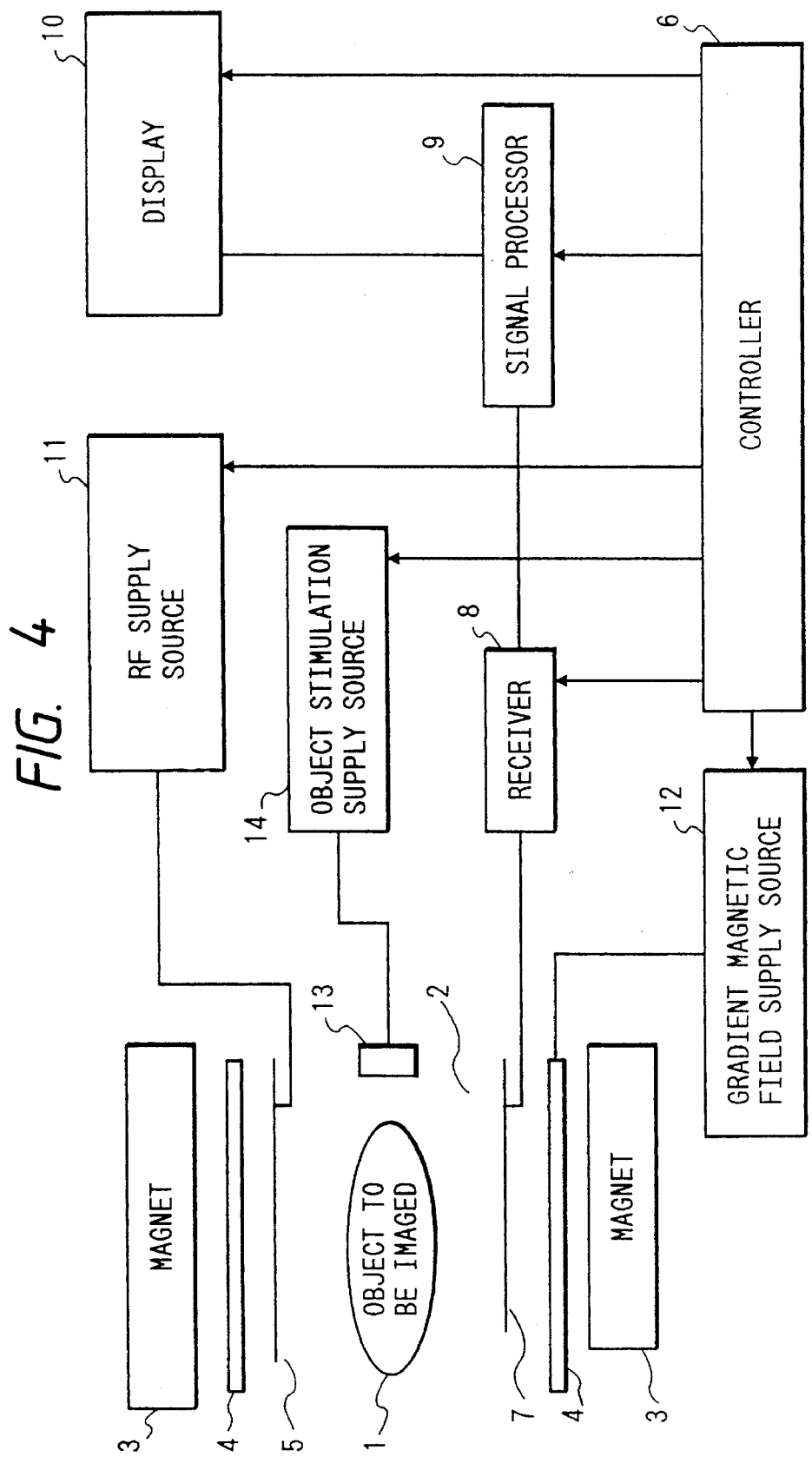
FIG. 4 is a block diagram showing an embodiment of a magnetic resonance imaging apparatus according to the present invention.

FIG. 4 shows an embodiment of an MRI apparatus according to the present invention. The MRI apparatus mainly comprises a magnet 3 for generating a static magnetic field in a space 2 occupied by an object 1 to be imaged, gradient magnetic field coils 4 for generating a gradient magnetic field pulse in the space, a radio frequency (hereinafter, referred to as "RF") probe 5 for generating a radio frequency magnetic fields pulse in the space, a controller 6 for controlling the above, an RF probe 7 for receiving the nuclear magnetic resonance (MR) signals generated from the object 1 to be imaged, a receiver 8 for detecting the signals from the RF probe 7, a signal processor 9 for processing the detected signals and converting the signals into image signals, a display 10 for displaying an image based on the image signals, and an object stimulator 13 for stimulating the object to be imaged 1 with light, sound or the like.

The magnet 3 is used for generating a strong and uniform static magnetic field in the space within which around the object 1 to be imaged is arranged, and the typical strength of the magnetic field is 0.1 T to 4.7 T. The magnet 3 may be a superconducting magnet or a permanent magnet. The RF probe 5 is driven by the output from an RF supply source 11 controlled by the controller 6 and generates radio frequency pulses having a frequency of 4 MHz to 200 MHz. The gradient magnetic field coils 4 are driven by the output from a gradient magnetic field supply source 12 controlled by the controller 6, and generates gradient magnetic field pulses $G_X$, $G_Y$ and $G_Z$ in the three directions X, Y and Z perpendicular to each other, respectively. The cross-section (or slice) of the object 1 to be imaged can be set by the manner how these gradient magnetic field pulses are applied. The controller 6 controls the width of the radio frequency pulses generated by the radio frequency probe 5 and/or the amplitude of the gradient magnetic field pulses generated simultaneously with the radio frequency magnetic field pulses so as to vary them corresponding to the amount of phase encoding given by the gradient magnetic field pulses applied after application of the radio frequency pulses, which will be described later.

The receiver 8 detects the MR signals from the object to be imaged using the RF probe 7. In a case of multi-slice imaging, the receiver 8 detects signals corresponding to the images of n slices of n (n is the positive integer) spatially laminated. The signal processor 9 converts the signals detected by the receiver 8 into the image signals through performing calculations such as complex Fourier transformation, image processing and so on. In a case of multi-slice imaging, when the signal processor 9 performs calculation on the image of the i-th slice (i is the positive integer, where $1 < i \leq n$) among the images of n slices, the calculation is performed such that part of the signals are used in common between the i-th slice and the (i-1)-th slice, as described later. The display 10 displays the signals processed in such a manner as an image.

The object stimulator 13 is used for measuring the reaction of the brain against a stimulation. The object stimulator 13 generates light, sound or the like to stimulate the human body. In order to obtain a brain function image, a cross-section of the brain is imaged while the brain is being stimulated with light or the like using the brain stimulator 13 driven by a object stimulation supply source 14, a normal image without stimulation being subtracted from the image above, the resultant subtracted image being emphasized by color display or the like, and the resultant emphasized image being superposed on the normal image without stimulation to display.

The MRI apparatus having such construction described above is typically employed in imaging by the SE method or the GrE method, and further employed in the imaging method (including multi-slice imaging) according to the present invention which will be described below.

Figure 5:
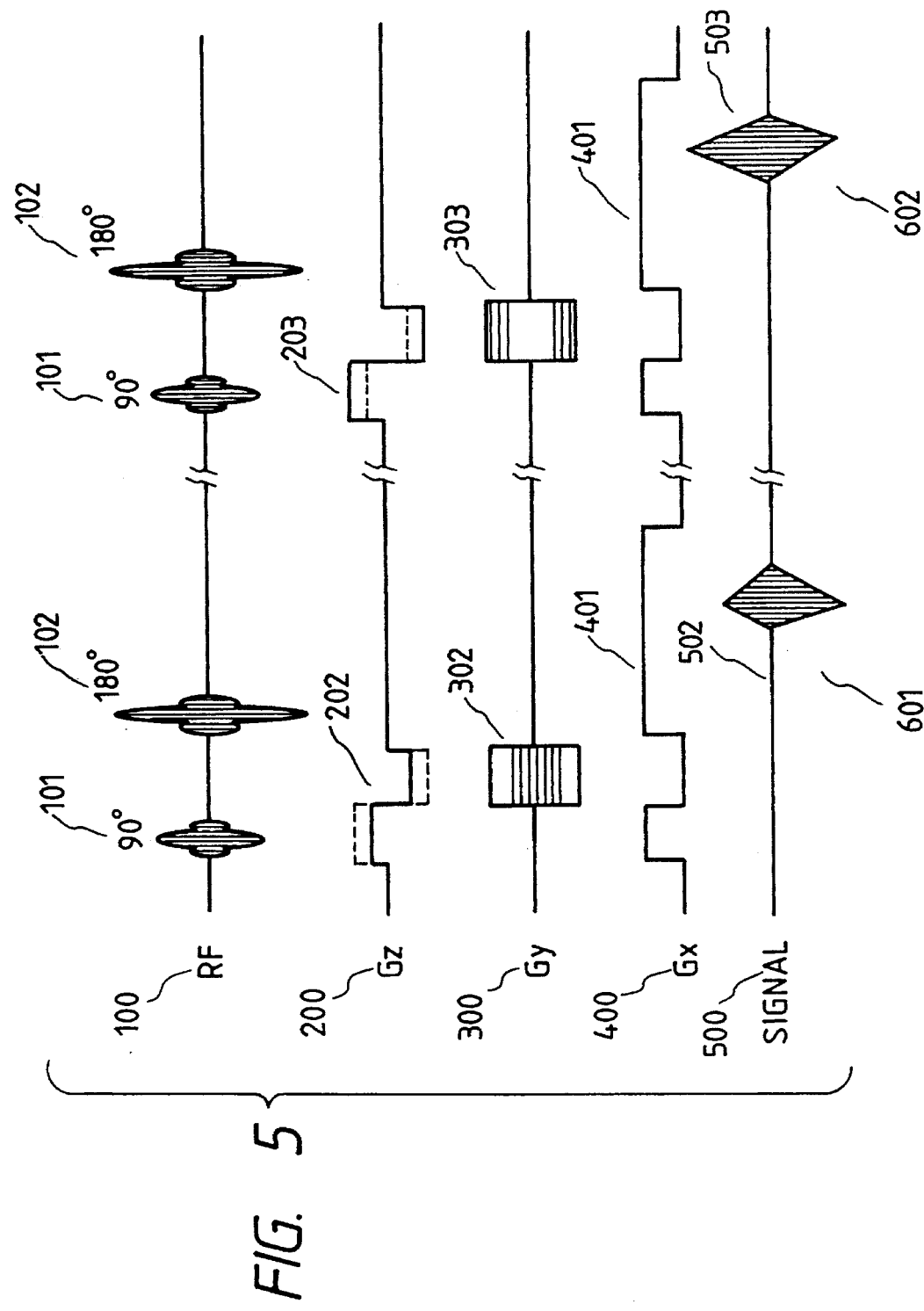
FIG. 5 is a view showing an embodiment of a magnetic resonance imaging pulse sequence for explaining the method according to the present invention.

An embodiment of an imaging method using such an MRI apparatus according to the present invention will be described below, referring to the imaging pulse sequence in FIG. 5.

The embodiment is a modified method of the spin echo method in FIG. 1, where in order to obtain one image, the 256 (from −128 to 128, wherein excluding 0) phase encoding gradient magnetic field pulses $G_Y$ 300 are used, and as the slice selecting gradient magnetic field pulses $G_Z$ 200, two kinds of the pulses different in the pulse amplitudes (pulse heights) 202, 203 are used corresponding to the absolute value of the magnitude of the phase encoding gradient magnetic field pulses 300.

That is, firstly the radio frequency pulse 101 and the slice selecting gradient magnetic field pulse $G_Z$ 202 are applied to an object to be imaged to selectively excite a specified slice of the object to be imaged. At this time, when the amplitude (pulse height) of the phase encoding gradient magnetic field pulse $G_Y$ 302 used in this measurement is within the range between −64 and 64, the pulse having the low amplitude 202 is used as the slice selecting gradient magnetic field pulse $G_Z$. Next, in order to encode spacial information in the Y-direction to the phase of the signal, the phase encoding gradient magnetic field gradient pulse $G_Y$ is applied and then the read-out gradient magnetic field pulse $G_X$ 401 is applied to obtain an echo signal 502. The remainder of the process is that the pulse sequence 601 is repeated 128 times until the absolute value of the amount of phase encoding becomes 64 by varying the phase encoding gradient magnetic field pulse $G_Y$ 302 in a step to detect the signals 502 of 128 sets.

Then, similarly, the radio frequency pulse 101 and the slice selecting gradient magnetic field pulse $G_Z$ 203 are applied to selectively excite a specified slice in the object to be imaged. Therein, the pulses 303 having the amount of phase encoding of 65 to 128 and −65 to 128 are used as the phase encoding gradient magnetic field pulses $G_Y$. With corresponding to this, the pulse having the high amplitude 203 is used as the slice selecting gradient magnetic field pulse $G_Z$. Next, the phase encoding gradient magnetic field pulse $G_Y$ 303 is applied, and the read-out gradient magnetic field pulse $G_X$ 401 to obtain an echo signal 503. The remainder of the process is that the pulse sequence 602 is repeated 128 times until the absolute value of the amount of phase encoding becomes 128 by varying the phase encoding gradient magnetic field pulse $G_Y$ 303 in a step to detect the signals 503 of 128 sets. In this measurement, data in the regions having the thin thickness of slice is obtained since the pulse having the high amplitude is used as the slice selecting gradient magnetic field pulse $G_Z$.

Figure 6:
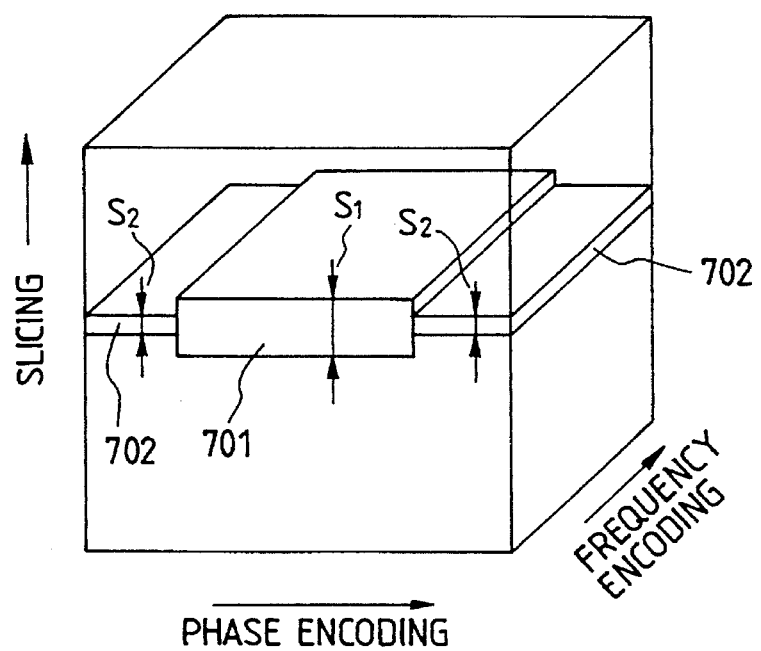
FIG. 6 is a schematic perspective view showing the region of signals obtained by using the magnetic resonance imaging pulse sequence in FIG. 5.

A sheet of image is reconstituted from the signals of 256 sets obtained by repeating of the two pulse sequences 601, 602. FIG. 6 schematically shows the signals obtained by these pulse sequences. FIG. 6 shows a two-dimensional phase space composed of phase encoding axis and frequency encoding axis combined with the axis in the slicing direction in the real space. In this embodiment, the amount of frequency encoding is constant against each of the amount of phase encoding. The region 701 having the amount of phase encoding of −64 to 64 is the region where the signals are obtained in the pulse sequence 601 in FIG. 5, and the thickness of slice S1 is, for example, 10 mm. On the other hand, the region 702 having the amount of phase encoding of −128 to −65 and 65 to 128 is the region where the signals are obtained in the pulse sequence 602 in FIG. 5, and the thickness of slice S2 is, for example, 5 mm.

The signal processor 9 reconstitutes an image using the signals in these regions 701 and 702. Therein, since the signal in the region 701 is the data when the thickness of the slice is twice as thick as that the signal in the region 702, the signal in the region 701 is multiplied by 0.5 to level the signal to the signal in the region 702 to perform complex Fourier transformation.

Although in the above embodiment, described is the case where the amplitude of the slice encoding gradient magnetic field pulse $G_Z$ is varied to change the slice thickness, the change of the slice thickness may be preformed by changing the band width of the frequency component of the radio frequency magnetic field pulse 101.

In this case, the frequency band width of the radio frequency magnetic field pulse 101 is narrowed when the amplitude of the phase encoding gradient magnetic field pulse 302 or 303 is large, and the band width of frequency components contained in the radio frequency magnetic field pulse 101 is widened when the amplitude of the phase encoding gradient magnetic field pulse 302 or 303 is small. Further, it is possible to obtain the required slice thickness by changing the amplitude of the slice selecting gradient magnetic field pulse 202 and the width of the radio frequency pulse 101 at the same time.

For example, assuming the slice selecting gradient magnetic field $G_Z$ is 1.5 mT/m and data under the slice thickness is 10 mm is acquired, $\Delta f = 42.57 \times 10^6 \times 1.5 \times 10^{-3} \times 10^{-2} = 638$ Hz since the gyromagnetic ratio ($\gamma/2\pi$) is 42.57 (MHz/T) when the subject nucleus is proton. Therefore, when the band width $\Delta f$ of the frequency components contained in the radio frequency pulse is set in 638 Hz, the data in the foregoing slice thickness can be obtained. Similarly, in a case where the slice selecting gradient magnetic field $G_Z$ is 10 mT/m and data under the slice thickness is 10 mm is acquired, $\Delta f = 4.257$ kHz. Therefore the band width $\Delta f$ of the frequency components contained in the radio frequency pulse is set in 4.527 kHz. Further, when the slice thickness is changed to 7 mm, the band width $\Delta f$ of the frequency components is changed to 2.975 kHz with keeping the slice selecting gradient magnetic field $G_Z$ at constant, or the slice selecting gradient magnetic field $G_Z$ is increased to 14.28 mT/m with keeping the band width $\Delta f$ of the frequency components constant.

As described above, in a region where the absolute value of the amount of phase encoding is small, the S/N ratio in the region is improved by acquiring the data in the thick slice. And in a region where the absolute value of the amount of phase encoding is large, the spatial resolution in the region is improved by acquiring the data in the thin the slice.

Figure 3:
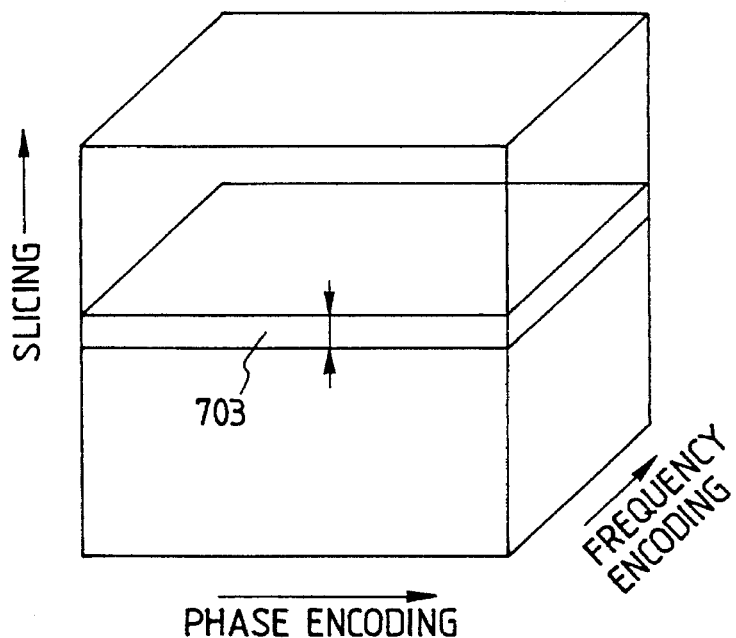
FIG. 3 is a schematic perspective view showing the region of signals obtained by using the conventional magnetic resonance imaging pulse sequence in FIG. 1 or FIG. 2.

In other words, in the conventional imaging sequence, the slice thickness in the direction of the phase encoding in the region 703 is constant as shown in FIG. 3, for example, the value is 7 mm. On the other hand, according to the present invention, in the region 701 where the amount of phase encoding is small corresponding to the low frequency region, the slice thickness is increased to 10 mm from the thickness of 7 mm in the conventional method, and the S/N ratio is improved. Further, in the region 702 where the amount of phase encoding is large corresponding to the high frequency region, the slice thickness is decreased to 5 mm from the thickness of 7 mm in the conventional method, and the high frequency component can be detected further clearly. Therefore, by reconstructing an image using these signals, it is possible to obtain an image having a high S/N ratio and a high resolution as compared with that obtained through the conventional method.

Although the above embodiment has been described under the condition where the amount of frequency encoding is constant against each of the amount of phase encoding, the number of times of data acquisition in the direction of frequency encoding may be varied in connection with the amount of phase encoding according to necessity.

Further although the above embodiment has been described in the case where the present invention is applied to a common SE method, the present invention may be also applied to the fast SE method using multi-echoes.

Figure 7:
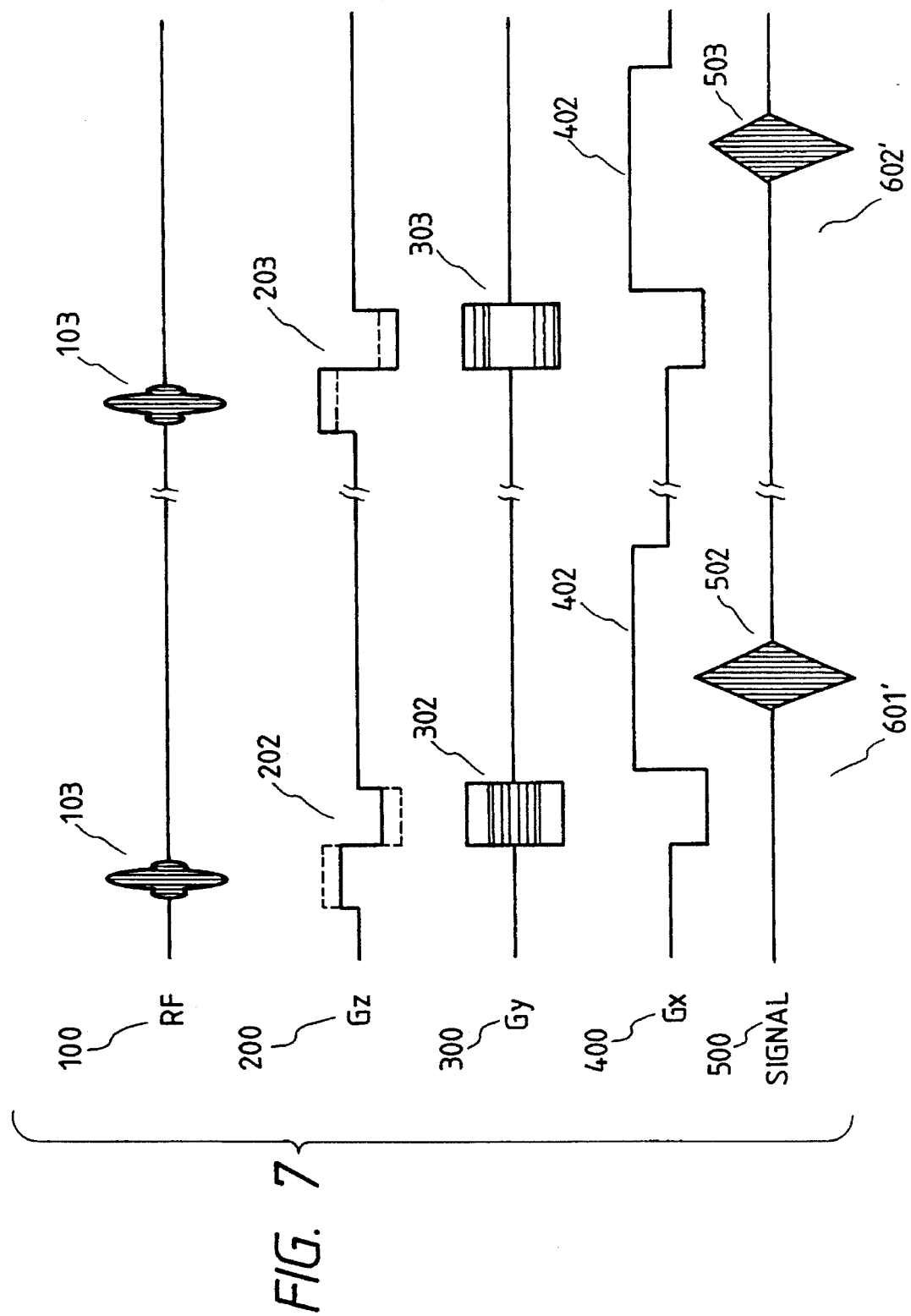
FIG. 7 is a view showing another embodiment of a magnetic resonance imaging pulse sequence for explaining the method according to the present invention.

Another embodiment of applying the present invention to a GrE method will be described below, referring to the pulse sequence shown in FIG. 7.

Figure 2:
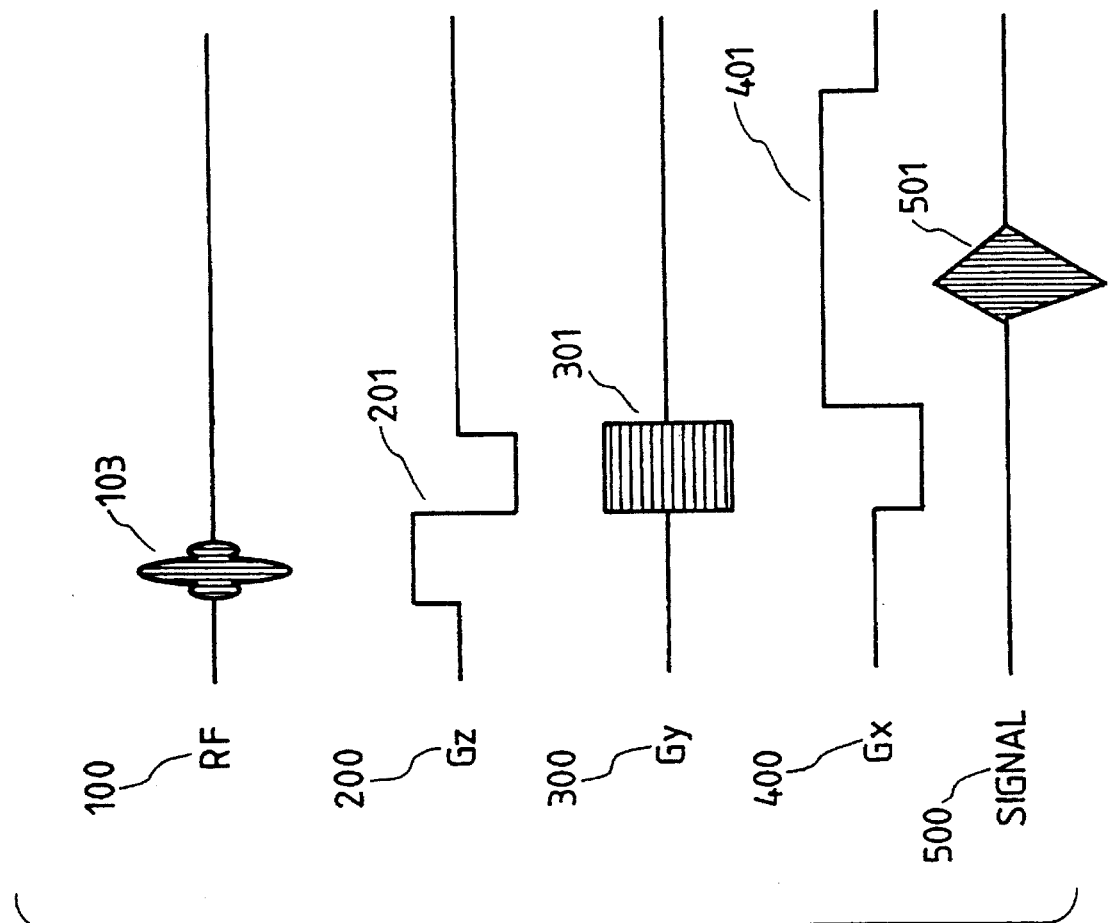
FIG. 2 is a view showing another conventional magnetic resonance imaging pulse sequence.

In the pulse sequence similar to the pulse sequence for the GrE method shown in FIG. 2, the radio frequency pulse 103 and the slice selecting gradient magnetic field pulse $G_Z$ 200 are applied to an object to be imaged to excite a specified slice of the object. The phase encoding gradient magnetic field pulse $G_Y$ 300 is applied in order to encode spatial information in the Y-direction into the phase of the signal. Then, the read out gradient magnetic field pulse $G_X$ 400 is so applied as to generate an echo signal 500. Such steps are repeated while varying the amount of the phase encoding given by the phase encoding gradient magnetic field pulse in a step to detect a plurality of sets of the signal trains. Therein, the slice selecting gradient magnetic field pulse also consists of two kinds of the pulses 202 and 203 different in amplitude from each other, which are properly used corresponding to the amount of phase encoding. That is, when the amount of phase encoding given by the phase encoding gradient magnetic field pulse is within, for example, the range of −64 to 64 (pulse sequence 601'), the slice selecting gradient magnetic field pulse 202 having the low amplitude is used for selective exiting. And when the amount of phase encoding given by the phase encoding gradient magnetic field pulse is within, for example, the range of −128 to −65 and 65 to 128 (pulse sequence 602'), the slice selecting gradient magnetic field pulse 203 having the high amplitude is used for selective exiting.

In the case of applying the present invention to the GrE method as in the case of applying the present invention to the SE method, the thickness of the slice may be changed by varying the amplitude of the slice selecting gradient magnetic field pulse and the band width of the frequency components of the radio frequency pulse instead of varying the amplitude of the slice selecting gradient magnetic field pulse.

It can be understood from the embodiments described above that the present invention may be applied not only to the specified imaging sequence but also to all of the pulse sequences such as, for example, a fast GrE method utilizing a small flip angle pulse for the radio frequency pulse, a multi-shot echo planer method and so on.

Described below will be an embodiment where the method according to the present invention is applied to multi-slice imaging detecting a three-dimensional space as a plurality of laminated two-dimensional images.

In a case where multi-slice imaging is performed on a region 1000 having, for example, a thickness of 20 mm in the direction of slicing as shown in FIG. 8, when the amount of phase encoding is in the range of −128 to −65 and 65 to 128, each of the four adjacent slices 1201 to 1204 is imaged with the thickness of the slice of 5 mm by controlling the magnitude of the slice selecting gradient magnetic field pulse or the width of radio frequency pulse. Thereby, signals for each of the regions 1201 to 1204, which are four partitioned regions of the region 1200 in the region 1000, is acquired. And when the amount of phase encoding is in the range of −64 to 64, signals for each of the two slices (regions 1101 and 1102) is acquired with, for example, the thickness of the slice of 10 mm, twice as thick as the thickness above, by controlling the magnitude of the slice selecting gradient magnetic field pulse or the width of radio frequency pulse. The order of the signal acquisition may be whether the signals in the four-partitioned regions are acquired first then the signals in the two-partitioned regions are acquired, or, on the contrary, the order of, for example, 1101, 1102, 1201, 1202, 1203, 1204.

The signal acquisition can be preformed through the pulse sequence such as the SE method or the GrE method according to the present invention as described in connection with FIG. 5 or FIG. 7. Although the number of times of data acquisition in the direction of frequency encoding may be varied corresponding to the amount of phase encoding or may be constant irrespective of the amount of phase encoding. In the embodiment shown in FIG. 8, the number of times of data acquisition in the direction of frequency encoding is constant over all the regions.

As described above, the signals to obtain a two-dimensional image are given as a group of a plurality of nuclear magnetic resonance signals obtained by varying the amount of phase encoding, and part of the group of the signals is used in common among images when the signal processor 9 reconstructs each of a plurality of two-dimensional images using the signals. That is, in the embodiment shown in FIG. 8, the image of the slice 1001 is reconstructed using the signals of the region 1101 and the region 1201, and the image of the slice 1002 is reconstructed using the signals of the region 1101 and the region 1202. Therefore, the signal of the region 1101 is used when the two-dimensional image of the slice 1001 is reconstructed and also when the two-dimensional image of the slice 1002 is reconstructed. Similarly, the image of the slice 1003 is reconstructed using the signals of the region 1102 and the region 1203, and the image of the slice 1004 is reconstructed using the signals of the region 1102 and the region 1204.

Where part of the signals obtained in the predetermined values of phase encoding are used in common between two-dimensional images of two slices adjacent to each other, the signals used thus in common are leveled. The leveling is mainly performed on offset correction and gain correction between the signals different in the thickness of the slice. That is, since the amount of signals in a thick slice is relatively large, the signal gain is corrected with taking it in consideration. And in advance of complex Fourier transformation, phase correction is performed between the signals different in the thickness of the slice if necessary. The phase correction is preferably performed such that in each of signals different in the thickness of the slice, part of the phase-encoded signals are redundantly detected with changing the thickness of the slice, and the phase correction is performed using the difference in the phases.

As described above, in the embodiment, since the thickness of the slice is increased to apparently decrease the number of the slices in a signal region where the absolute value of the amount of phase encoding is small, a multi-slice image can be obtained in a short time. In other words, the number of repeat of the sequence in the embodiment is 128×2=256 times in the region (1100) where the amount of phase encoding is −64 to 64, 128×4=512 times in the region (1200) where the amount of phase encoding is −128 to −65 and 65 to 128, and the total of 768 times. On the other hand, since the number of repeat of the sequence in the conventional method is 256 times for each slice, the number of repeat becomes to the total of 256×4=1024. Therefore, the imaging time in the embodiment is 768/1024=0.75 in ratio and is shortened by 25% against the time required by a conventional method.

FIG. 9 shows another embodiment of a multi-slice imaging according to the present invention.

In the figure, multi-slice imaging is performed on a region having, for example, thickness of 16 mm in the direction of slicing with each slice of 1 mm thickness, and the region 1000 is divided into five regions, region 1300 having the absolute value of the amount of phase encoding of less than 8, region 1400 having the value of 9 to 16, region 1500 having the value of 17 to 32, region 1600 having the value of 33 to 64 and region 1700 having the value of 65 to 128. The field of view is 256 mm. The number of pixels is 256×256.

In this method, the signal for the region 1301 is acquired with thickness equivalent to 16 slices at a time. The region 1400 (1401, 1402) having thickness equivalent to 16 slices is split into 2 regions, the region 1500 being split into 4 regions, the region 1600 being split into 8 regions, the region 1700 being split into 16 regions, and signal for each region is acquired. The SE method shown in FIG. 5 or the GrE method shown in FIG. 7 can be employed as the sequence of signal acquisition as described in the embodiment shown in FIG. 8. The order of the acquisition sequence may be performed, for example, such that the acquisition starts first from the region 1300, then the region 1400 in order of 1401, 1402, the region 1500 in order of 1501, 1502, 1503, 1504, ... and the region 1700 in order of ... 1716. The acquisition sequence may be performed in the other order.

The method of splitting the amount of phase encoding in this embodiment is shown in a table in FIG. 10.

It can be understood from FIG. 10 that in the embodiment, the thickness of the slice changes when the phase encoding number corresponding to the amount of phase encoding exceeds the value proportional to the n-th power of 2 such as 8, 16, 32, 64 ... , the thickness of the slice being determined by the width of the radio frequency pulse and the amplitude of the slice selecting gradient magnetic field pulse applied at the time when the radio frequency pulse is applied. By doing so, it can be understood that the geometric size of each of the phase encoding regions 1300 to 1700 on the corresponding real space in the direction of phase encoding agrees to or is proportional to the thickness of the slice in each of the regions.

The spatial frequency corresponding to each of the regions is also shown in FIG. 10, and is 0–0.3 1 p/mm in the region 1300, 0.25~0.5 1 p/mm in the region 1700. In the embodiment, as shown in FIG. 6, every 16 slices are measured in the diagnostically important region 1700 corresponding to 0.25~0.5 1 p/mm. In the other regions, the number of times of measurement is successively decreases as the thickness of the slice increases. As described above, in the embodiment, the signals different in the thickness of the slice are measured every phase encoding, and the number of times of signal acquisition has a weight in the spatial frequency domain by considering the frequency characteristic to be emphasized contained in a final image having parts to be emphasized. Therefore, the method can provide an image having plenty of diagnostic information in a short time as compared with a conventional method.

The number of repeating times of the sequence in the embodiment is a total of 2736 as shown in FIG. 11.

Since the number of repeating times of the sequence in the conventional multi-slice imaging is 256×16=4096, the imaging time in the embodiment is 2736/4096=0.68 in ratio and is shortened by 33% against the time required by the conventional method.

As described above, in the multi-slice imaging according to the present invention, the thickness of the slice is increased and the number of the slices is decreased in the signal region where the absolute value of the amount of phase encoding is small, and the thickness of the slice is decreased and the number of the slices is increased in the signal region where the absolute value of the amount of phase encoding is large.

The present invention may be used by combining with the well-known half-Fourier imaging sequence, or applied to a fast GrE imaging sequence having a small flip angle, and therefore applied to brain functional imaging using multi-slicing. Further, it can be applied to a GrE method of multi-echo type. Furthermore, it can be applied to a multi-shot echo planer method, and therefore can be applied to fast brain functional imaging or fast three-dimensional imaging of the heart.

It can be understood from the embodiments described above that, according to the present invention, the S/N ratio can be improved and the imaging time to obtain a lot of image sheets can be shortened by increasing the slice thickness when acquiring a phase-encoded signal corresponding to a low spatial frequency component, since the amplitude of the slice selecting gradient magnetic field pulse and/or the width of the radio frequency pulse determining the thickness of the slice are changed corresponding to the amount of phase encoding with focusing attention to the quality of signals detected in the common or multi-slice imaging. Further, the quality of image can be improved with increasing the spacial resolution by thinning the slice thickness when acquiring a phase-encoded signal corresponding to a high spatial frequency component.

Furthermore, according to the present invention, an image can be reconstructed with a small number of times of signal acquisition or in a short time of signal acquisition by using parts of the signals in common between the adjacent slices when reconstructing two-dimensional images in the multi-slice imaging.

What is claimed is:

1. A magnetic resonance imaging method, which comprises the steps of:

repeatedly applying a radio frequency pulse, a slice selecting gradient magnetic field pulse along a first axis, a phase encoding gradient magnetic field pulse along a second axis perpendicular to said first axis and a frequency encoding gradient magnetic field pulse along a third axis perpendicular to said first and second axes to an object to be imaged which is placed in a static magnetic field while varying an amount of phase encoding given by said phase encoding gradient magnetic field pulse to thereby generate nuclear magnetic resonance signals from a slice of said object normal to said first axis;

changing a thickness of said slice corresponding to said amount of phase encoding given by said phase encoding gradient magnetic field pulse so that said nuclear magnetic resonance signals are obtained from said slice which has been changed in thickness; and producing an image of said object in accordance with said nuclear magnetic resonance signals obtained from said slice which has been changed in thickness.

2. A magnetic resonance imaging method according to claim 1, wherein said thickness changing step includes changing the thickness of said slice so that when the absolute value of said amount of phase encoding given by said phase encoding gradient magnetic field pulse is small, the thickness of said slice becomes thicker than that when the absolute value of said amount of phase encoding given by said phase encoding gradient magnetic field pulse is large.

3. A magnetic resonance imaging method according to claim 1, wherein said thickness changing step includes changing the thickness of said slice so that when the absolute value of said amount of phase encoding given by said phase encoding gradient magnetic field pulse is small, the thickness of said slice becomes thicker than that when the absolute value of said amount of phase encoding given by said phase encoding gradient magnetic field pulse is large by changing an amplitude of said slice selecting gradient magnetic field pulse.

4. A magnetic resonance imaging method according to claim 1, wherein said thickness changing step includes changing the thickness of said slice so that when the absolute value of said amount of phase encoding given by said phase encoding gradient magnetic field pulse is small, the thickness of said slice becomes thicker than that when the absolute value of said amount of phase encoding given by said phase encoding gradient magnetic field pulse is large by changing a frequency band of said radio frequency pulse.

5. A magnetic resonance imaging method, which comprises the steps:

repeatedly applying a radio frequency pulse, a slice selecting gradient magnetic field pulse along a first axis, a phase encoding gradient magnetic field pulse along a second axis perpendicular to said first axis and a frequency encoding gradient magnetic field pulse along a third axis perpendicular to said first and second axes to an object to be imaged which is placed in a static magnetic field while varying an amount of phase encoding given by said phase encoding gradient magnetic field pulse to thereby produce nuclear magnetic resonance signals from a plurality of laminated slices of said object which are normal to said first axis;

changing a thickness of said slices corresponding to said amount of phase encoding given by said phase encoding gradient magnetic field pulse so that said nuclear magnetic resonance signals are obtained from said slices which have been changed in thickness; and producing a multi-slice image of said object by reconstructing two-dimensional images of said slices in accordance with said nuclear magnetic resonance signals obtained from said slices which have been changed in thickness.

6. A magnetic resonance imaging method according to claim 5, wherein part of any one of said plurality of slices is in common with a part of a slice adjacent thereto.

7. A magnetic resonance imaging method according to claim 6, wherein said thickness changing step includes changing the thicknesses of said slices so that when the absolute value of said amount of phase encoding given by said phase encoding gradient magnetic field pulse is small, the thicknesses of each of said slices becomes thicker than that when the absolute value of said amount of phase encoding given by said phase encoding gradient magnetic field pulse is large.

8. A magnetic resonance imaging method according to claim 7, wherein said thickness changing step includes varying the thicknesses of said slices by changing an amplitude of said slice selecting gradient magnetic field pulse.

9. A magnetic resonance imaging method according to claim 7, wherein said thickness changing step includes varying the thicknesses of said slices by changing a frequency band of said radio frequency pulse.

10. A magnetic resonance imaging method according to claim 6, further comprising the step of partitioning said slices into a plurality of regions in a direction of said second axis, the thickness of said plurality of regions being substantially equal to a size thereof on a corresponding real space in the direction of said second axis.

11. A magnetic resonance imaging method according to claim 6, further comprising the step of partitioning said slices into a plurality of regions in a direction of said second axis in proportion to the n-power of 2, the thicknesses of said slices varying in correspondence with said plurality of regions.

12. A magnetic resonance imaging method according to claim 6, wherein said nuclear magnetic resonance signals are produced by a gradient echo method, fast spin echo method or echo planer method.

13. A magnetic resonance imaging apparatus, which comprises:

means for generating a static magnetic field in which an object to be imaged is arranged;

means for generating a radio frequency pulse applied to said object;

means for generating a slice selecting gradient magnetic field pulse, a phase encoding gradient magnetic field pulse and a frequency encoding gradient magnetic field pulse which are applied to said object along first, second and third axes perpendicular to each other, respectively;

means for controlling the timing of applying said slice selecting gradient magnetic field pulse, said phase encoding gradient magnetic field pulse and said frequency encoding gradient magnetic field pulse while changing the amount of phase encoding given by said phase encoding gradient magnetic field pulse so as to generate nuclear magnetic resonance signals from said object;

means for detecting said generated nuclear magnetic resonance signals;

means for processing said detected nuclear magnetic resonance signals to thereby reconstruct an image of said object in accordance with said detected nuclear magnetic resonance signals; and means for displaying the image of said object in accordance with said processed detected nuclear magnetic resonance signals;

said timing controlling means changing at least one of a width of said radio frequency pulse and an amplitude of said slice selecting gradient magnetic field pulse in accordance with said amount of phase encoding.

14. A magnetic resonance imaging apparatus according to claim 13, wherein said nuclear magnetic resonance signals comprise signals obtained from n slices of said object (n is the positive integer) which are spatially laminated in a direction normal to said first axis and said processing means is so operated that part of said nuclear magnetic resonance signals are used in common to reconstruct images of the i-th slice and (i-1)-th slice, where $1 < i \leq n$.

* * * * *